US010958862B2

(12) United States Patent
Yamazaki (10) Patent No.: US 10,958,862 B2
(45) Date of Patent: Mar. 23, 2021

(54) IMAGE SENSOR AND METHOD OF CONTROLLING THE SAME, AND IMAGE CAPTURING APPARATUS

(71) Applicant: CANON KABUSHIKI KAISHA, Tokyo (JP)

(72) Inventor: Katsuya Yamazaki, Nagahama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 28 days.

(21) Appl. No.: 16/408,565

(22) Filed: May 10, 2019

(65) Prior Publication Data

US 2019/0364238 A1 Nov. 28, 2019

(30) Foreign Application Priority Data

May 24, 2018 (JP) .............................. JP2018-099795

(51) Int. Cl.
*H04N 5/3745* (2011.01)
*H01L 27/146* (2006.01)
*H04N 5/341* (2011.01)

(52) U.S. Cl.
CPC ... *H04N 5/37455* (2013.01); *H01L 27/14605* (2013.01); *H04N 5/341* (2013.01)

(58) Field of Classification Search
CPC .. H04N 5/37455; H04N 5/341; H04N 5/3532; H04N 9/0451; H04N 5/378; H01L 27/14605
See application file for complete search history.

(56) References Cited

U.S. PATENT DOCUMENTS

| 6,838,651 B1* | 1/2005 | Mann | H01L 27/14645 |
| | | | 250/208.1 |
| 2013/0089175 A1* | 4/2013 | Mo | H04N 5/3532 |
| | | | 377/49 |
| 2015/0288903 A1* | 10/2015 | Oshima | H04N 5/347 |
| | | | 348/301 |
| 2017/0276807 A1* | 9/2017 | Nishihara | H04N 5/378 |

FOREIGN PATENT DOCUMENTS

| JP | 2002-366887 A | 12/2002 |
| JP | 2005-311821 A | 11/2005 |

* cited by examiner

*Primary Examiner* — Lin Ye
*Assistant Examiner* — Tuan H Le
(74) *Attorney, Agent, or Firm* — Cowan, Liebowitz & Latman, P.C.

(57) ABSTRACT

An image sensor comprises: a pixel unit including a plurality of pixels, each of the pixels including a photoelectric converter that photoelectrically converts received light into a charge, a charge accumulation portion that holds the charge, and a transfer circuit provided between the photoelectric converter and the charge accumulation portion; AD converters that AD-convert electrical signals read out from the pixel unit, a first number of the AD converters being provided for each of columns of the pixel unit; and one or more processors and/or circuitry which functions as a controller that controls readout of the pixel unit. The first number is a plural number, and the controller controls the transfer circuits to transfer the charges from the photoelectric converters to the charge accumulation portions every number of rows that is lower than the first number.

9 Claims, 10 Drawing Sheets

| | NUMBER OF PIXELS | FRAMERATE (fps) | 1V TIME (ms) | 1H TIME (us) | ADC CLK FREQUENCY (GHz) |
|---|---|---|---|---|---|
| 2K | 1920<br>1080 | 30 | 33.33 | 30.86 | 0.53 |
| 2K | 1920<br>1080 | 60 | 16.67 | 15.43 | 1.06 |
| 4K | 3840<br>2160 | 30 | 33.33 | 15.43 | 1.06 |
| 4K | 3840<br>2160 | 60 | 16.67 | 7.72 | 2.12 |
| 8K | 7680<br>4320 | 60 | 16.67 | 3.86 | 4.25 |
| 8K | 7680<br>4320 | 120 | 8.33 | 1.93 | 8.49 |

IMAGE SENSOR AND METHOD OF CONTROLLING THE SAME, AND IMAGE CAPTURING APPARATUS

BACKGROUND OF THE INVENTION

Field of the Invention

The present invention relates to an image sensor and a method of controlling the same, and an image capturing apparatus, and particularly relates to a technique for efficiently reading out signals from an image sensor.

Description of the Related Art

Recent years have seen major advances in terms of higher resolutions and speeds in digital single-lens reflex cameras, digital video cameras, and the like that use image sensors constituted by photoelectric converters.

For example, resolutions are increasing, with the number of pixels in image sensors growing from 1920×1080 to 3840×2160, and furthermore to 7680×4320. At the same time, framerates used when shooting moving images are becoming faster, increasing from 30 fps to 60 fps, and furthermore to 120 fps.

An increase in the resolution, framerate, and so on of image data output from an image sensor results in a corresponding increase in the operation frequency of AD converters provided in the image sensor.

Figure 10:
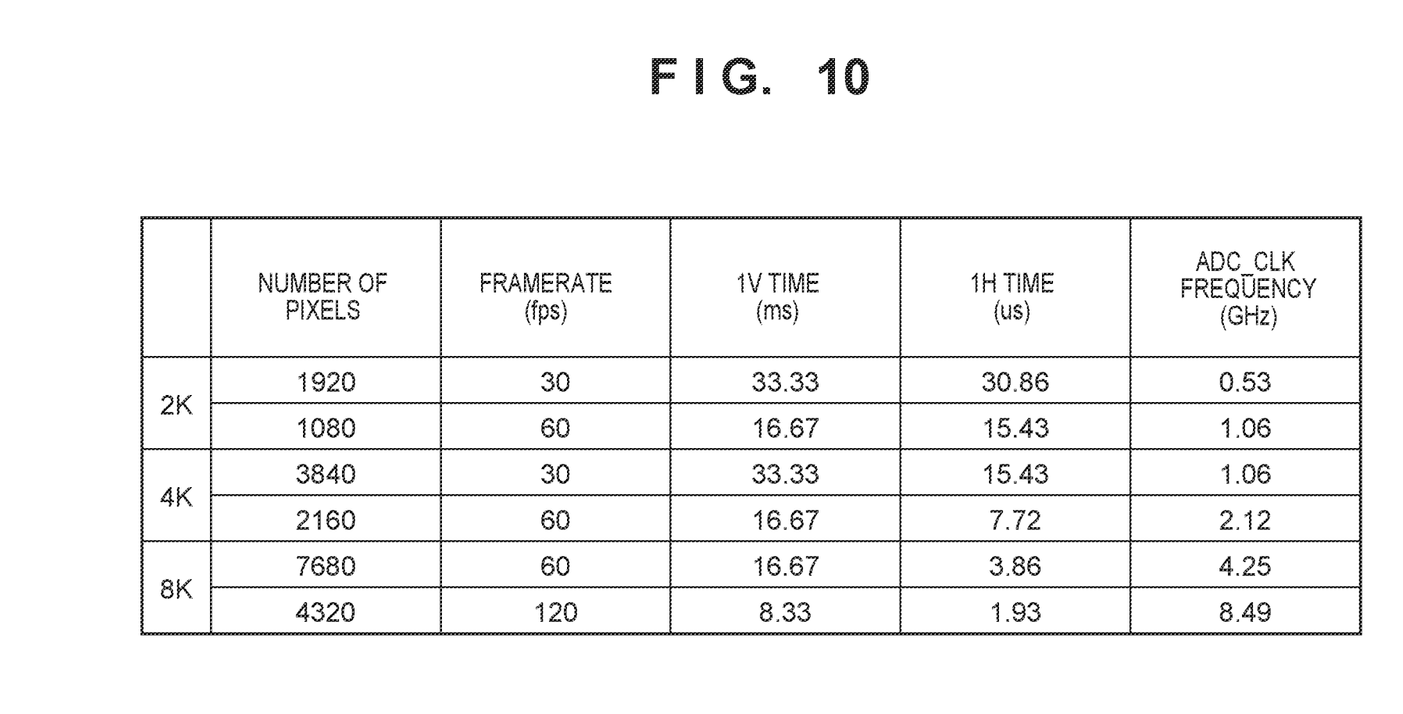
FIG. 10 is a diagram systematically illustrating operation frequencies of image sensors.

FIG. 10 indicates the operation frequency of a 14-bit AD converter for each of moving image framerates (in Frames Per Second, or "fps") and numbers of pixels, when pixel signals from the pixels are quantized by the AD converter. As illustrated in FIG. 10, when image data corresponding to 3840×2160 pixels is read out at 60 fps, the frequency is calculated as 60×2160×2^14≈2.12 GHz, which means that the AD converter is required to operate at an extremely high frequency.

As a method for reading out signals from an image sensor at high speeds, Japanese Patent Laid-Open No. 2002-366887 discloses dividing a CMOS image sensor into a plurality of units of rows and then carrying out exposure and readout every unit of a plurality of rows, which shortens the readout time from the CMOS image sensor and enables high-speed operation.

Furthermore, as a technique for increasing the speed of frame readout in an apparatus that uses a CMOS image sensor, Japanese Patent Laid-Open No. 2005-311821 discloses a configuration in which a plurality of column readout lines are provided for each of columns in the CMOS image sensor, and a plurality of rows are allocated among the plurality of column readout lines. According to the configuration disclosed in this document, a plurality of rows are read out simultaneously, which shortens the readout from the CMOS image sensor and enables high-speed operations.

However, with the conventional technique disclosed in Japanese Patent Laid-Open No. 2002-366887, the CMOS image sensor is divided into a plurality of units of rows, and the exposure and readout are carried out every unit of a plurality of rows. As such, rolling shutter distortion, which occurs during readout from known CMOS image sensors, will arise every unit of a plurality of rows. In other words, there is a problem in that the rolling shutter distortion will arise every unit of a plurality of rows, and the distortion will appear greater at the boundaries between the units of a plurality of rows.

With the conventional technique disclosed in Japanese Patent Laid-Open No. 2005-311821 as well, a plurality of rows in the CMOS image sensor are read out simultaneously, which means that like Japanese Patent Laid-Open No. 2002-366887, rolling shutter distortion will arise every unit of a plurality of rows, and the distortion will appear greater at the boundaries between the units of a plurality of rows.

SUMMARY OF THE INVENTION

The present invention has been made in consideration of the above situation, and makes it possible to read out signals at high speeds from an image sensor while reducing rolling shutter distortion.

According to the present invention, provided is an image sensor comprising: a pixel unit including a plurality of pixels, each of the pixels including a photoelectric converter that photoelectrically converts received light into a charge, a charge accumulation portion that holds the charge, and a transfer circuit provided between the photoelectric converter and the charge accumulation portion; AD converters that AD-convert electrical signals read out from the pixel unit, a first number of the AD converters being provided for each of columns of the pixel unit; and one or more processors and/or circuitry which functions as a controller that controls readout of the pixel unit, wherein the first number is a plural number; and the controller controls the transfer circuits to transfer the charges from the photoelectric converters to the charge accumulation portions every number of rows that is lower than the first number.

Further, according to the present invention, provided is a method of controlling an image capturing apparatus, the apparatus comprising: a pixel unit including a plurality of pixels, each of the pixels including a photoelectric converter that photoelectrically converts received light into a charge, a charge accumulation portion that holds the charge, and a transfer circuit provided between the photoelectric converter and the charge accumulation portion; AD converters that AD-convert electrical signals read out from the pixel unit, a first number of the AD converters being provided for each of columns; and one or more processors and/or circuitry which functions as a controller that controls readout of the pixel unit, wherein the first number being a plural number, the method comprising: controlling the transfer circuits to transfer the charges from the photoelectric converters to the charge accumulation portions every number of rows that is lower than the first number.

Furthermore, according to the present invention, provided is an image capturing apparatus comprising: an image sensor having a pixel unit including a plurality of pixels, each of the pixels including a photoelectric converter that photoelectrically converts received light into a charge, a charge accumulation portion that holds the charge, and a transfer circuit provided between the photoelectric converter and the charge accumulation portion; AD converters that AD-convert electrical signals read out from the pixel unit, a first number of the AD converters being provided for each of columns of the pixel unit; and one or more processors and/or circuitry which functions as a controller that controls readout of the pixel unit, wherein the first number is a plural number; and the controller controls the transfer circuits to transfer the charges from the photoelectric converters to the charge accumulation portions every number of rows that is lower than the first number; and one or more processors and/or circuitry which functions as an image processor that carries out image processing on a signal output from the image sensor.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

DESCRIPTION OF THE EMBODIMENTS

Exemplary embodiments of the present invention will be described in detail in accordance with the accompanying drawings.

Figure 1:
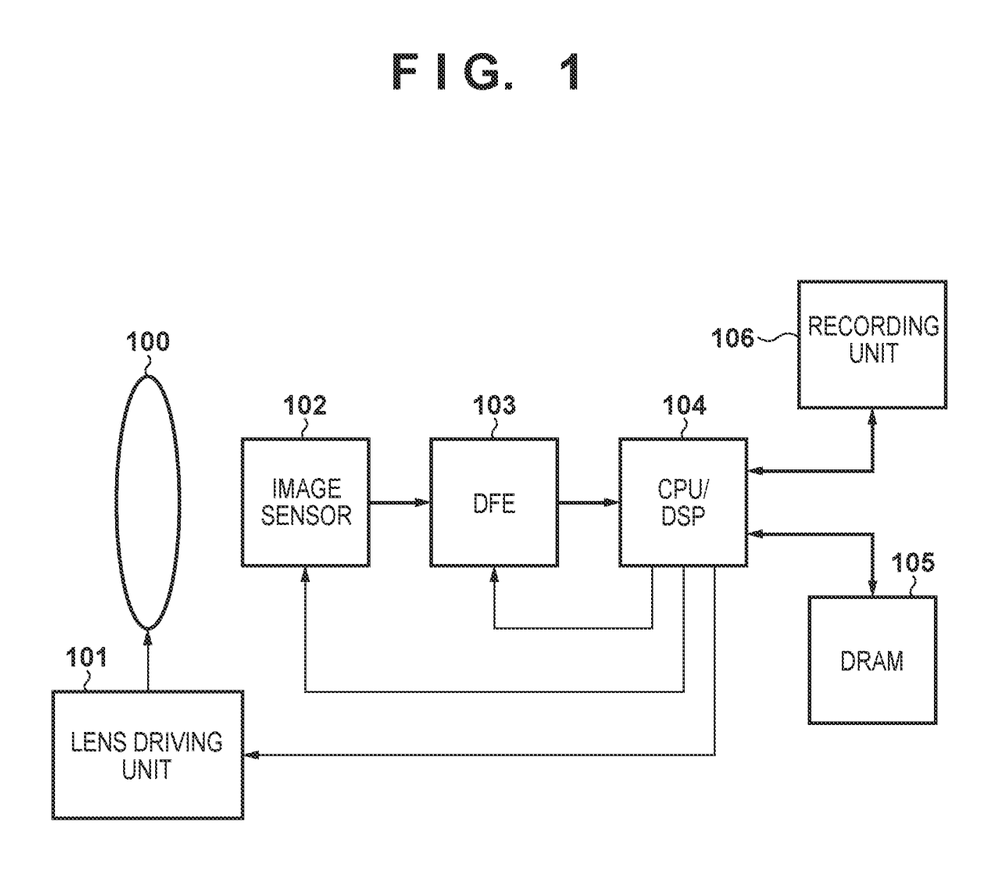
FIG. 1 is a block diagram illustrating an overall configuration of an image capturing apparatus according to embodiments of the present invention.

FIG. 1 is a block diagram illustrating an overall configuration of an image capturing apparatus according to embodiments of the present invention. In FIG. 1, a lens unit 100 is constituted by an optical system including a focus lens, a zoom lens, an aperture stop, and the like. A lens driving unit 101 drives the focus lens, the zoom lens, the aperture stop, and the like of the lens unit 100 as appropriate on the basis of instructions from a Central Processing Unit (CPU)/Digital Signal Processor (DSP) 104. As a result, object light incident on the lens unit 100 forms an image on an image sensor 102.

The image sensor 102 includes a photoelectric converter that converts light received through the lens unit 100 into an electrical signal based on the intensity of the light, and the analog electrical signal obtained from the conversion by the photoelectric converter is converted into a digital electrical signal and output. A digital front end (DFE) 103 carries out simple digital processing on the electrical signal output by the image sensor 102, such as rearranging, adding, and the like of a plurality of pixels. The CPU/DSP 104 generates image data by subjecting the digital signal processed by the DFE 103 to high-level digital image processing such as color gamut conversion, white balance correction, gamma correction, flaw correction, image compression processing, and the like. The CPU/DSP 104 furthermore controls the lens driving unit 101, controls operations of the image sensor 102, carries out various types of control of the DFE 103, and the like.

Dynamic Random Access Memory (DRAM) 105 is used as buffer memory for performing tasks when the CPU/DSP 104 carries out the high-level digital image processing. A recording unit 106 records image signals generated by the CPU/DSP 104 into a recording medium, and the format thereof is not particularly limited.

Figure 2:
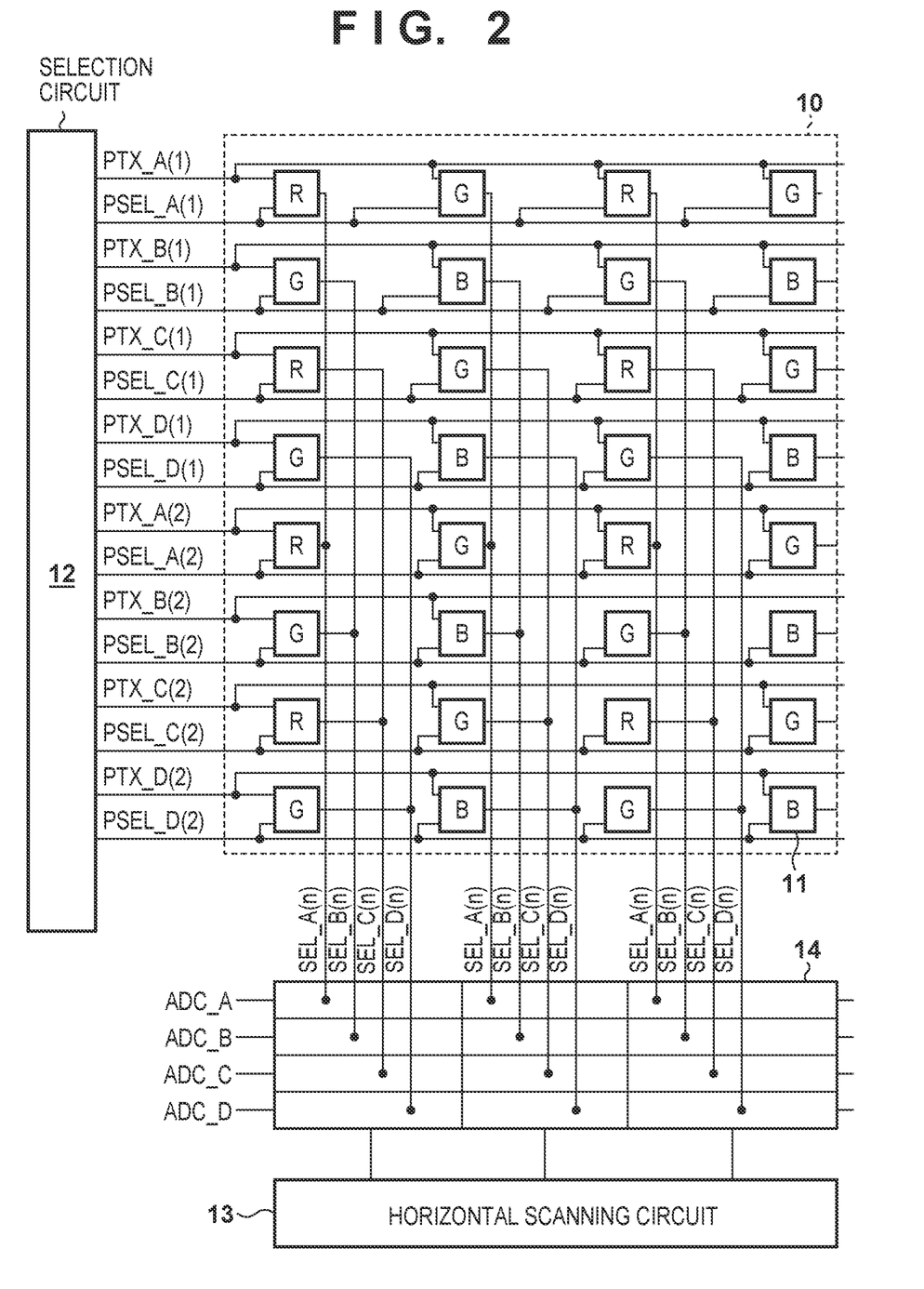
FIG. 2 is a diagram illustrating an example of a configuration of an image sensor according to embodiments.

FIG. 2 is a diagram illustrating an example of the configuration of the image sensor 102. As illustrated in FIG. 2, the image sensor 102 includes a pixel unit 10, a selection circuit 12, a horizontal scanning circuit 13, and an AD conversion unit 14.

In the pixel unit 10, a plurality of pixels 11, each of which includes a photoelectric converter, are arranged in a matrix. Although FIG. 2 illustrates 8 rows×4 columns of the pixels 11, there are actually several hundred to several thousand rows and columns of the pixels 11. Furthermore, the pixels in the pixel unit 10 are covered with filters in, for example, what is known as a Bayer array, including R (red), G (green), and B (blue), as illustrated in FIG. 2. The configuration of the pixel unit 10 is not limited thereto, however, and other filters such as C (cyan), M (magenta), and Y (yellow) may be used as well.

The selection circuit 12 selects a plurality of the pixels 11 included in the pixel unit 10 in units of rows. The AD conversion unit 14 converts the electrical signals from the pixels 11 selected by the selection circuit 12 into digital signals. In the present embodiment, the AD conversion unit 14 is configured including four AD converters ADC_A to ADC_D for each column, with four rows being taken as a single group, and thus AD conversion can be carried out in parallel on a group-by-group basis. The horizontal scanning circuit 13 carries out control so that the digital signals obtained from the conversion by the AD conversion unit 14 are output in sequence on a column-by-column basis.

Figure 3:
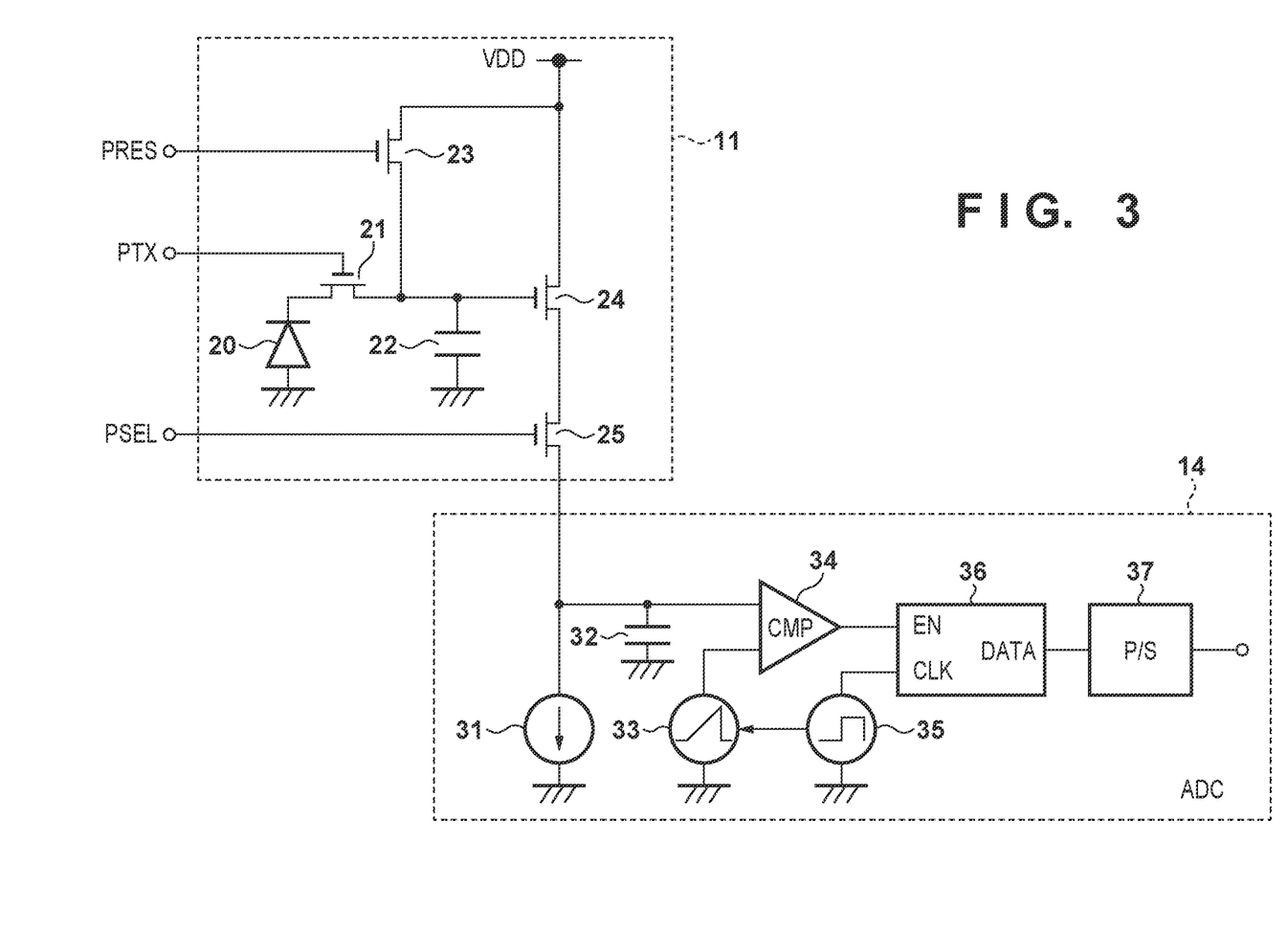
FIG. 3 is a diagram illustrating an example of a configuration of a pixel and an AD conversion unit according to embodiments.

FIG. 3 is a diagram illustrating the configurations of one of the pixels 11 illustrated in FIG. 2 and one of the four AD converters ADC_A to ADC_D constituting the AD conversion unit 14 accompanying that pixel 11, along with control signals. Note that one of the AD converter ADC_A to ADC_D is indicated by "ADC" in FIG. 3.

The pixel 11 will be described first. A photodiode (PD) 20 is a photoelectric converter that converts received light into a charge. A transfer transistor 21 transfers the charge generated by the PD 20 to a floating diffusion unit (FD) 22 (a charge accumulation portion) in response to a PTX signal. A reset transistor 23 is controlled by a PRES signal, and resets the FD 22 to a power source voltage VDD when turned on. An amplifying transistor 24 is an amplifying transistor for outputting a signal corresponding to the charge accumulated in the FD 22. A select transistor 25 is controlled by a PSEL signal, and outputs the signal amplified by the amplifying transistor 24 to the AD conversion unit 14 when turned on.

Although the pixel 11 according to the present embodiment is constituted by the PD 20, the transfer transistor 21, the FD 22, the reset transistor 23, the amplifying transistor 24, and the select transistor 25, it should be noted that the configuration is not limited thereto. For example, the configuration may be such that the pixel 11 is provided with a plurality of PDs 20, memory having functionality equivalent to that of the FD 22, or the like.

The AD converter ADC constituting the AD conversion unit 14 will be described next. A constant current circuit 31 is a current circuit for driving a source terminal of the amplifying transistor 24 at a constant current load. The value of the voltage amplified by the amplifying transistor 24 is held in a sample/hold (SH) circuit 32 as a pixel signal. A ramp circuit 33 generates a ramp signal in which the signal level increases or decreases with the lapse of time based on the value of a range over which the pixel signal in the SH circuit 32 is obtained. The output of the SH circuit 32 and the ramp signal generated by the ramp circuit 33 are input to a comparison circuit 34.

Figure 4:
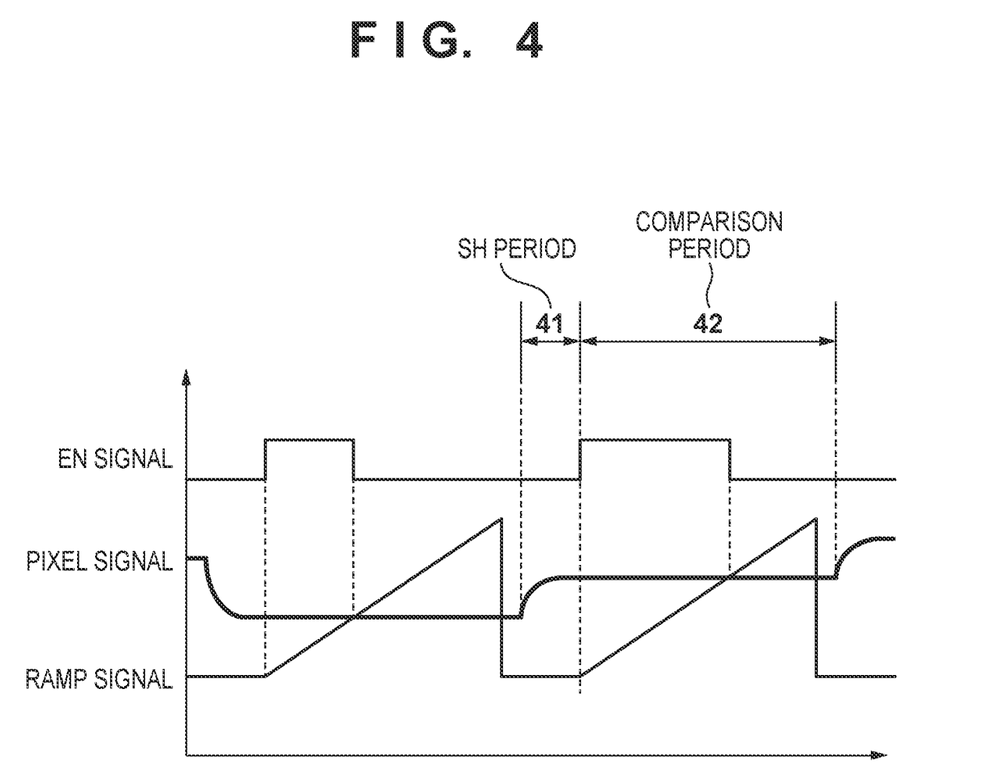
FIG. 4 is a timing chart illustrating input/output operations of a comparison circuit according to embodiments.

FIG. 4 illustrates operations of the comparison circuit 34 in a simplified manner. An SH period 41 is a period for holding the pixel signal output from the pixel 11 in the SH circuit 32. A comparison period 42 is a period in which the pixel signal output from the SH circuit 32 and the level of the ramp signal are compared. Generally speaking, the combined period of the SH period 41 and the comparison period 42 corresponds to a horizontal synchronization period or a period shorter than the horizontal synchronization period. For example, the horizontal synchronization period for reading out 3840 horizontal×2160 vertical pixel signals at 60 fps is 60 (fps)×2160≈130 KHz.

The comparison circuit 34 outputs a high-level EN signal to a counter circuit 36 in a later stage from when the ramp signal begins to increase to when the ramp signal exceeds the pixel signal. Here, the operation frequency of the ramp circuit 33 depends on the resolution of the pixel signal. For example, when the resolution is 14 bits, it is necessary for the counter circuit 36 to carry out $2^{14}$=16384 counting operations in the horizontal synchronization period.

A clock circuit 35 generates a clock serving as a reference for operating the ramp circuit 33 and the counter circuit 36. For example, an operation frequency of greater than or equal to 130 KHz×16384≈2.12 GHz is necessary to carry out 16384 counts at 130 KHz, which substantially corresponds to the horizontal synchronization period when reading out the 3840 horizontal×2160 vertical pixel signals at 60 fps mentioned above.

Note that the ramp circuit 33 and the clock circuit 35 need not be provided in each ADC, and may be provided for a single AD conversion unit 14, or for each of the plurality of AD converters ADC_A to ADC_D.

The counter circuit 36 is a 14-bit binary counter for counting the clock output by the clock circuit 35 during a period where the EN signal output from the comparison circuit 34 is at high level. However, if the counter circuit 36 is constituted as the most basic binary counter, transitions in the counter value will result in places where the count value varies greatly. For example, when the count value transitions from "01_1111_1111_1111" to "10_0000_0000_0000", all of the bits invert, which can produce a large amount of digital noise. In addition to binary counters, gray code counters, which are configured so that the counter value always transitions with only 1 bit inverting, are known, and the counter circuit 36 may employ a gray code counter to suppress digital noise.

A P/S conversion circuit 37 converts the 14-bit count value counted by the counter circuit 36 into serial data and outputs the serial data to the DFE 103 in a later stage. Note, however, that the P/S conversion circuit 37 may be omitted, and the 14-bit parallel data may be output to the DFE 103 in a later stage.

Although the present embodiment describes providing the four AD converters ADC_A to ADC_D, configured as described above, for each column of the pixels 11 as the AD conversion unit 14, the configuration is not limited thereto, and the four AD converters ADC_A to ADC_D may instead be provided every plurality of columns, for example. Furthermore, the number of the AD converters ADC provided for each column is not limited to four, and may be changed as appropriate in accordance with the number of rows included in each group.

Additionally, a sequential comparator type that uses a ramp signal has been described above as the configuration of the AD conversion unit 14. However, although doing so will increase the scale of the circuit, it is also possible to use a parallel comparator type AD conversion unit that operates a plurality of comparators in parallel, a recursive type AD conversion unit that connects multiple stages of N-bit sequential comparator type AD conversion units, or the like. Although a parallel comparator type or recursive type AD converter increases the circuit scale, such an AD converter does make it possible to keep the operation frequency lower than a sequential comparator type AD converter.

The image capturing apparatus configured as described above is the same in all of the embodiments described below.

First Embodiment

Figure 5:
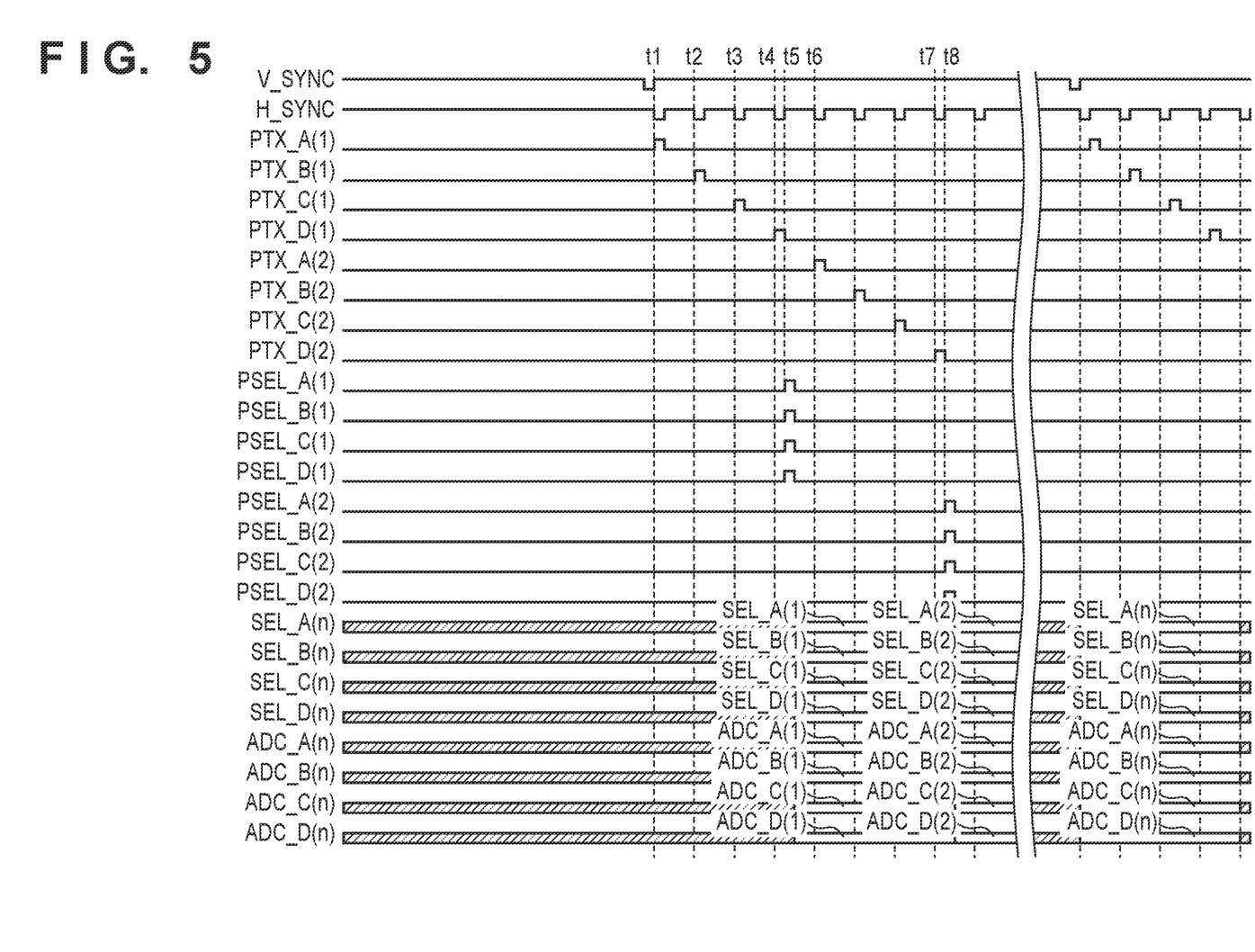
FIG. 5 is a timing chart illustrating operations of an image sensor according to a first embodiment.

A first embodiment of the present invention will be described next. FIG. 5 is a timing chart illustrating operations according to the first embodiment, when 3840 horizontal×2160 vertical pixel signals are read out at 60 fps, for example.

In FIG. 5, V_SYNC represents a vertical synchronization signal, and in the present embodiment, this is a 60 Hz signal corresponding to the framerate. H_SYNC represents a horizontal synchronization signal, and a number of signals corresponding to the number of rows of the pixels 11 constituting the pixel unit 10 are output during one vertical synchronization signal period. In the present embodiment, the frequency of the signal is 2160 rows×60 Hz=129.6 kHz.

As described above, in the present embodiment, the first row to the fourth row are taken as a single group (a first group), and every four rows are then processed as individual groups. The example of 8 rows×4 columns of the pixels 11 illustrated in FIG. 2 therefore constituted by two groups. In the following descriptions, (n), which represents the group number (where n=1 or 2), and A to D, which represent the first to fourth rows in each group, are added to the PTX signal that turns the transfer transistor 21 on/off and the PSEL signal that turns the select transistor 25 on/off.

First, at time t1, the selection circuit 12 sets PTX_A(1) to H level, selects the pixels 11 in the first row of the first group, drives the transfer transistors 21 of those pixels 11, and transfers the charges accumulated in the PDs 20 to the FDs 22. Likewise, at time t2, PTX_B(1) is set to H level and the transfer process is carried out for the second row of the first group, and at time t3, PTX_C(1) is set to H level and the transfer process is carried out for the third row of the first group. Furthermore, at time t4, PTX_D(1) is set to H level and the transfer process is carried out for the fourth row of the first group.

When the transfer process is complete for the first group, at time t5, the selection circuit 12 sets PSEL_A(1), PSEL_B(1), PSEL_C(1), and PSEL_D(1) to H level simultaneously to turn the select transistors 25 of the first to fourth rows on. As a result, SEL_A(1) is output as the signal of the first row of the first group; SEL_B(1) is output as the signal of the second row; SEL_C(1) is output as the signal of the third row; and SEL_D(1) is output as the signal of the fourth row to the AD conversion unit 14.

The signals SEL_A(1) to SEL_D(1) from the four rows of the first group, output to the AD conversion unit 14, are AD-converted into N-bit digital signals as described with reference to FIGS. 3 and 4. Here, the signals SEL_A(1) to SEL_D(1) are AD-converted during a period four times that of the horizontal synchronization signal, as illustrated in FIG. 5.

When AD-converting one row at a time, if the 3840 horizontal×2160 vertical pixel signals are read out at 60 fps and given a resolution of 14 bits, it is necessary for the counter circuit 36 to have an operation frequency of approximately 2.12 GHz. However, in the first embodiment, a period four times the horizontal synchronization signal can be used. This means that the operation frequency required for the counter circuit 36 can be greatly suppressed, i.e., to ¼, or approximately 0.53 GHz, which makes it easy to create the circuit.

Additionally, the AD conversion processes for the signals SEL_A(1) to SEL_D(1) are carried out in parallel, and at time t6, the selection circuit 12 sets PTX_A(2) to H level. As a result, the transfer transistors 21 of the pixels 11 in the first row of the second group (the fifth row overall) are driven, and the charges accumulated in the PDs 20 are transferred to the FDs 22. Likewise, the selection circuit 12 sets PTX_B(2) to H level and carries out the transfer process for the second row of the second group, sets PTX_C(2) to H level and carries out the transfer process for the third row of the second group, and sets PTX_D(2) to H level and carries out the transfer process for the fourth row of the second group, in that sequence. In other words, the charges accumulated in the PDs 20 of the second group, from the fifth to 8th rows, are transferred to the FDs 22, in parallel with the AD conversion process on the first group, from the first to fourth rows.

Thus according to the first embodiment, handling four rows as a single group makes it possible to suppress the operation frequency of the clock circuit 35 required for the AD conversion unit 14. On the other hand, the charge transfers from the PDs 20 to the FDs 22 are carried out at timings shifted on a row-by-row basis in synchronization with the horizontal synchronization signal H_SYNC, which makes it possible to read out the signals at high speeds while suppressing the accumulation of distortion from group to group, which has been a conventional problem.

Second Embodiment

Figure 6:
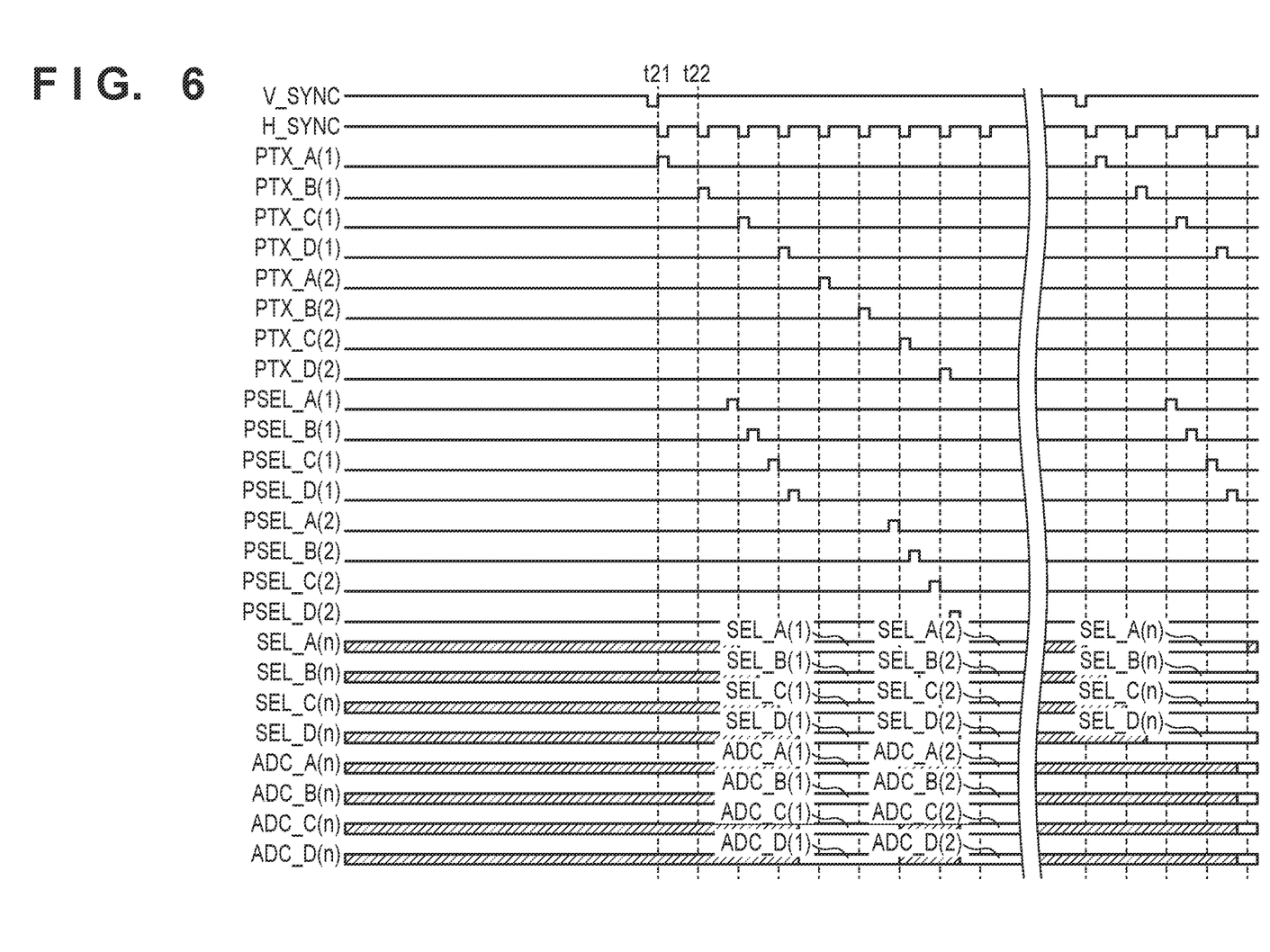
FIG. 6 is a timing chart illustrating operations of an image sensor according to a second embodiment.

A second embodiment of the present invention will be described next. FIG. 6 is a timing chart illustrating operations according to the second embodiment, when 3840 horizontal×2160 vertical pixel signals are read out at 60 fps, for example. Note that in FIG. 6, the same signals as those in the timing chart of FIG. 5 are indicated by the same signal names.

In the second embodiment too, the first to fourth rows are taken as the first group, and the electrical signals from the pixels 11 are read out and AD-converted. However, the timings of the readout and the AD conversion of the electrical signals from the pixels 11 are different from those in the first embodiment. As such, only the differences will be described below.

First, at time t21, the selection circuit 12 sets PTX_A(1) to H level, selects the pixels 11 in the first row of the first group, drives the transfer transistors 21 of those pixels 11, and transfers the charges accumulated in the PDs 20 to the FDs 22. When the transfer process ends for the first row, the selection circuit 12 sets PSEL_A(1) to H level and turns on the select transistors 25 in the first row at a given time after the transfer process is complete for the first row. As a result, the signal SEL_A(1), based on the charges held in the FDs 22 of the pixels 11 in the first row, is output to the AD conversion unit 14. Likewise, at time t22, the selection circuit 12 sets PTX_B(1) to H level, selects the pixels 11 in the second row of the first group, and sets PSEL_B(1) to H level. As a result, the signal SEL_B(1), based on the charges held in the FDs 22 in the second row of the first group, is output to the AD conversion unit 14. In the same manner, the signal SEL_C(1) is transferred to the AD conversion unit 14 in response to PTX_C(1) and PSEL_C(1) in the third row; and the signal SEL_D(n), in response to PTX_D(1) and PSEL_D(1) in the fourth row. Note that PSEL_A(1) to PSEL_D(1) are controlled to go to H level for a predetermined time interval so that after the transfer process ends for the first row, the output to the AD conversion unit 14 is completed before the transfer process for the first row of the second group begins.

In the first embodiment described above, the signals SEL_A(n) to SEL_D(n) for a single group are transferred to the AD conversion unit 14 in parallel, in response to PSEL_A(n) to PSEL_D(n). However, in the second embodiment, the transfer processes for the signals are carried out having been shifted by a given amount of time. As a result, the timings at which signals are read out from the pixels 11 are varied, which makes it possible to prevent local increases in energy consumption involved in the signal readout.

On the other hand, compared to the first embodiment, there is a tradeoff in that the signals SEL_A(n) to SEL_D(n) output to the AD conversion unit 14 have a shorter active period. For example, assume that as illustrated in FIG. 6, the time for which the AD conversion processes by the AD converters ADC_A to ADC_D overlap is two and a half horizontal synchronization periods. With the driving method of the first embodiment, illustrated in FIG. 5, if the 3840 horizontal×2160 vertical pixel signals at 60 fps are given a resolution of 14 bits, an operation frequency of approximately 0.53 GHz is required for the counter circuit 36. As opposed to this, in the second embodiment, only two and a half horizontal synchronization periods can be used, and thus the frequency required for the counter circuit 36 is approximately 0.84 GHz. However, the driving frequency can be suppressed compared to approximately 2.12 GHz which is the frequency required for the counter circuit 36 when AD-converting one row at a time.

Thus according to the second embodiment, handling four rows as a single group and carrying out processing such as that described above makes it possible to suppress the operation frequency of the clock circuit 35 required for the AD conversion unit 14 while preventing a local increase in the power involved in the readout. This in turn makes it possible to carry out high-speed readout while suppressing the accumulation of distortion on a group-by-group basis, which has been a conventional problem.

Third Embodiment

Figure 7:
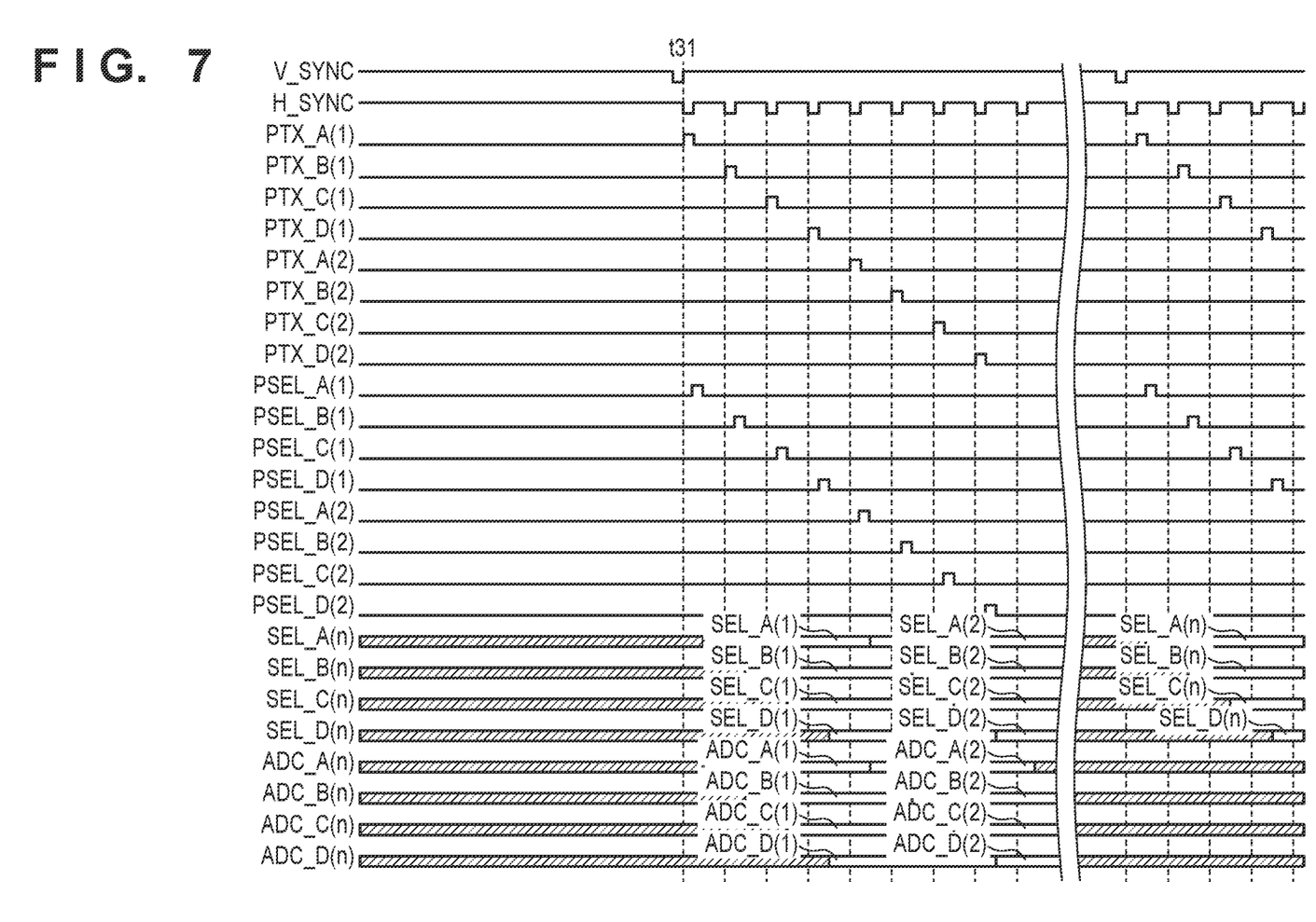
FIG. 7 is a timing chart illustrating operations of an image sensor according to a third embodiment.

A third embodiment of the present invention will be described next. FIG. 7 is a timing chart illustrating operations according to the third embodiment, when 3840 horizontal×2160 vertical pixel signals are read out at 60 fps, for example. Note that in FIG. 7, the same signals as those in the timing chart of FIG. 5 are indicated by the same signal names.

In the third embodiment too, the first to fourth rows are taken as the first group, and the electrical signals from the pixels 11 are read out and AD-converted. However, the timings of the readout and the AD conversion of the electrical signals from the pixels 11 are different from those in the first and second embodiments. As such, only the differences will be described below.

At time t31, when the charge transfer process is completed for the pixels 11 in the first row of the first group in response to PTX_A(1) output from the selection circuit 12, the selection circuit 12 then sets PSEL_A(1) to H level. As a result, SEL_A(1), based on the charges that had been held in the FDs 22 of the pixels 11 in the first row of the first group, is transferred to the AD conversion unit 14 by the select transistor 25. Likewise, when the transfer process is complete for the second row of the first group in response to PTX_B(1), the selection circuit 12 sets PSEL_B(1) to H level, and the signal SEL_B(n), based on the charges that had been held in the FDs 22 of the pixels 11 in the second row of the first group, is transferred to the AD conversion unit 14. Next, PSEL_C(1) and PSEL_D(1) are set to H level after the transfer process ends for the third row of the first group in response to PTX_C(1) and the transfer process ends for the fourth row of the first group in response to PTX_D (1). As a result, the signals SEL_C(1) and SEL_D(n), based on the charges held in the FDs 22 of the pixels 11 in the third and fourth rows of the first group, are output to the AD conversion unit 14.

In the first embodiment described above, the signals SEL_A(n) to SEL_D(n) for a single group are transferred to the AD conversion unit 14 in parallel, in response to the signals PSEL_A(1) to PSEL_D(1). However, in the third embodiment, the processes of transfer to the AD conversion unit 14 are carried out in sequence after the transfer of the charge accumulated in the PD 20 of each pixel 11 to the FD 22 is complete. As a result, the timings at which signals are read out from the pixels 11 are varied, which makes it possible to prevent local increases in energy consumption involved in the signal readout.

On the other hand, compared to the first embodiment, the signals SEL_A(1) to SEL_D(1) output to the AD conversion unit 14 have mutually-different active periods. For example, when the transfer is shifted with each horizontal synchronization period as illustrated in FIG. 7, the timing at which the ramp circuit 33 used in the AD conversion unit 14 outputs the ramp signal is different by an amount equivalent to one horizontal synchronization signal each. Thus in the third embodiment, four of the ramp circuits 33, or a circuit that delays the ramp signal, is necessary, in accordance with the AD converters ADC_A, ADC_B, ADC_C, and ADC_D.

When AD-converting one row at a time, if the 3840 horizontal×2160 vertical pixel signals are read out at 60 fps and given a resolution of 14 bits, it is necessary for the counter circuit 36 to have an operation frequency of approximately 2.12 GHz. However, in the third embodiment, a period four times the horizontal synchronization signal can be used, in the same manner as in the first embodiment. This means that the operation frequency required for the counter circuit 36 can be greatly suppressed, i.e., to ¼, or approximately 0.53 GHz, which makes it easy to create the circuit.

Thus according to the third embodiment, handling four rows as a single group and carrying out processing such as that described above makes it possible to greatly suppress the operation frequency of the clock circuit 35 required for the AD conversion unit 14 while preventing a local increase in the power involved in the readout. This in turn makes it possible to carry out high-speed readout while suppressing the accumulation of distortion on a group-by-group basis, which has been a conventional problem.

Fourth Embodiment

Figure 8:
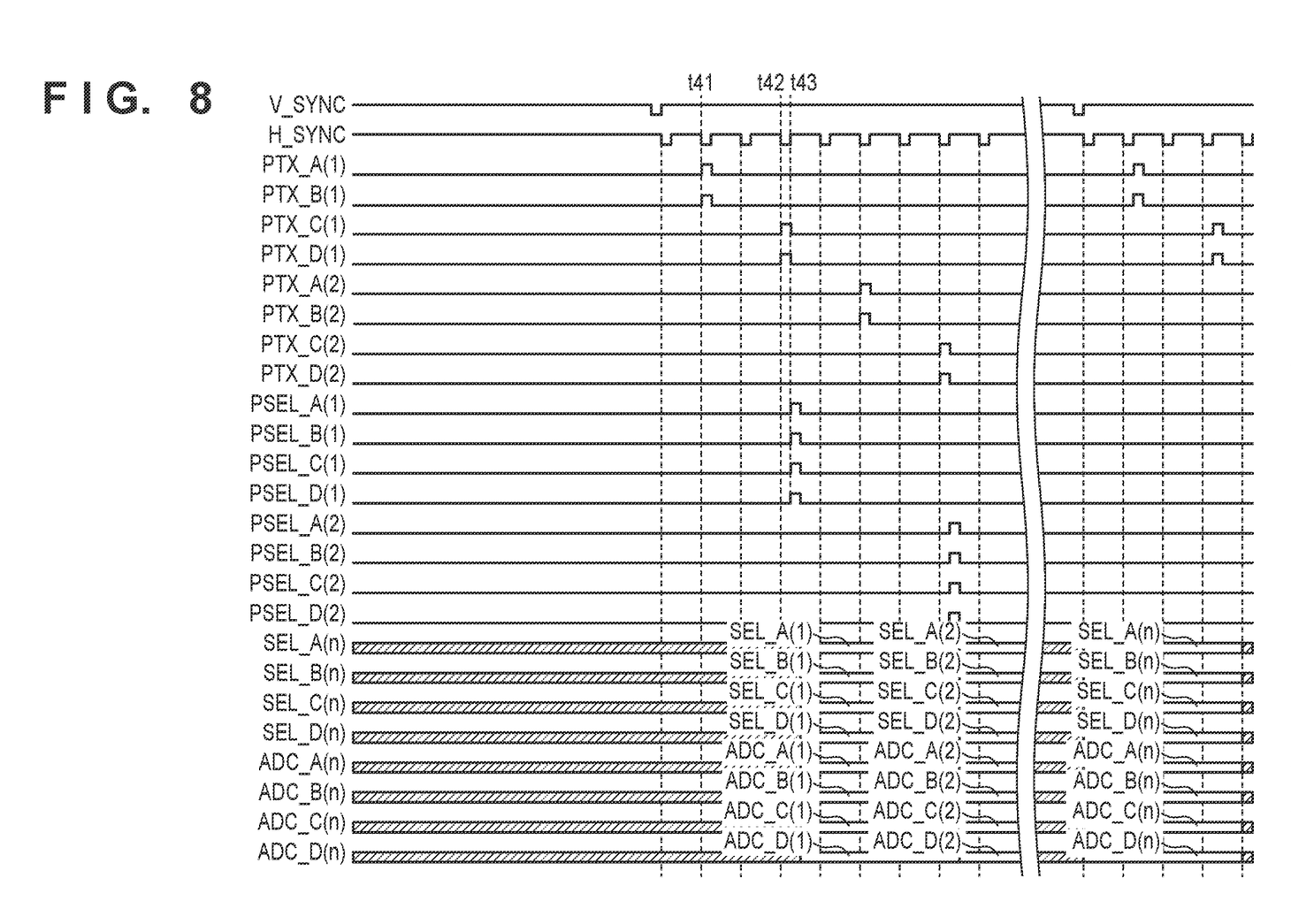
FIG. 8 is a timing chart illustrating operations of an image sensor according to a fourth embodiment.

A fourth embodiment of the present invention will be described next. FIG. 8 is a timing chart illustrating operations according to the fourth embodiment, when 3840 horizontal×2160 vertical pixel signals are read out at 60 fps, for example. Note that in FIG. 8, the same signals as those in the timing chart of FIG. 5 are indicated by the same signal names.

In the fourth embodiment too, the first to fourth rows are taken as the first group, and the electrical signals from the pixels 11 are read out and AD-converted. However, the following point is different from the first to third embodiments. That is, the timing at which the charge in the PD 20 of each pixel 11 is transferred to the FD 22 by the transfer transistor 21, the timing of the readout of the electrical signal from the FD 22, and the timing of the AD conversion process are different. As such, only the differences will be described below.

In the fourth embodiment, first, at time t41, the selection circuit 12 sets PTX_A(1) and PTX_B(1) to H level simultaneously. As a result, the transfer transistors 21 of the pixels 11 in the first row and the second row turn on simultaneously, and the charges in the PDs 20 of the two rows' worth of pixels 11 are transferred to the FDs 22 in parallel. In this case, the signal lines may be configured so that one of PTX_A(1) and PTX_B(1) is used in the transfer processes for the first row and the second row.

Likewise, at time t42, PTX_C(1) and PTX_D(1) are set to H level simultaneously, and the processes of transferring the charges from the PDs 20 to the FDs 22 in the third row and the fourth row are carried out in parallel. In this case too, the signal lines may be configured so that one of PTX_C(1) and PTX_D(1) is used in the transfer processes for the third row and the fourth row. Doing so makes it possible to reduce the number of signal lines in the selection circuit 12.

When the transfer process is complete for the first group, at time t43, the selection circuit 12 sets PSEL_A(1), PSEL_B(1), PSEL_C(1), and PSEL_D(1) to H level simultaneously to turn the select transistors 25 of the first to fourth rows on. Note that the process for reading out the electrical signals from the FDs 22 and AD-converting the signals using the AD conversion unit 14 is the same as that described in the first embodiment with reference to FIG. 5, and thus descriptions thereof will be omitted here. The above-described process is carried out in the same manner for the second group (the fifth row and on).

As illustrated in FIG. 8, in the fourth embodiment too, the signals SEL_A(n) to SEL_D(n) are AD-converted in a period four times the horizontal synchronization signal.

When AD-converting one row at a time, if the 3840 horizontal2160 vertical pixel signals are read out at 60 fps and given a resolution of 14 bits, it is necessary for the counter circuit 36 to have an operation frequency of approximately 2.12 GHz. However, in the fourth embodiment, a period four times the horizontal synchronization signal can be used. This means that the operation frequency required for the counter circuit 36 can be greatly suppressed, i.e., to ¼, or approximately 0.53 GHz, which makes it easy to create the circuit.

Thus according to the fourth embodiment, handling four rows as a single group and handling every two rows in a single group as a sub-group makes it possible to simplify the configuration of the selection circuit 12 and suppress the operation frequency of the clock circuit 35 required for the AD conversion unit 14. This in turn makes it possible to carry out high-speed readout while suppressing the accumulation of distortion on a group-by-group basis, which has been a conventional problem.

Fifth Embodiment

Figure 9:
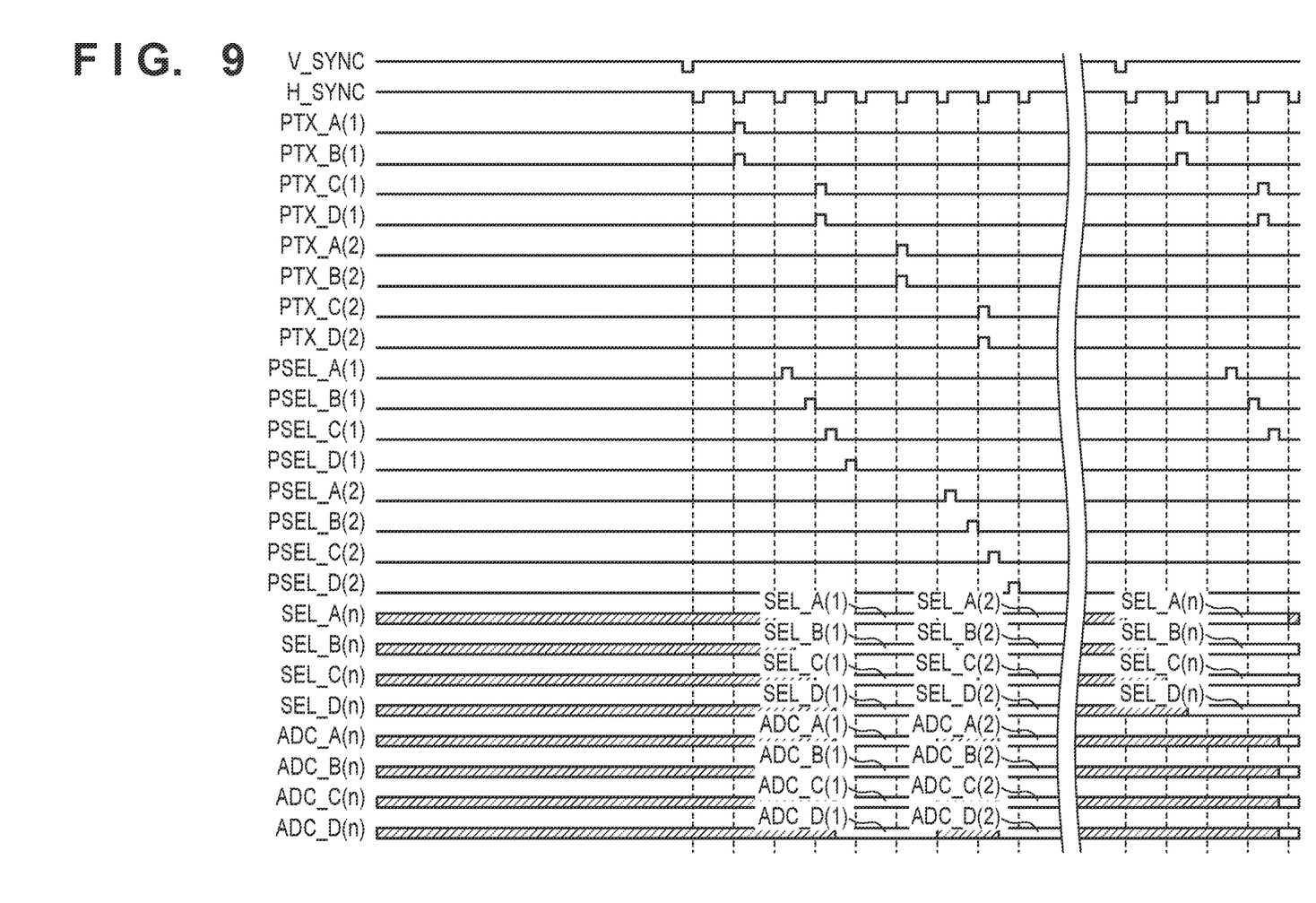
FIG. 9 is a timing chart illustrating operations of an image sensor according to a fifth embodiment.

A fifth embodiment of the present invention will be described next. FIG. 9 is a timing chart illustrating operations according to the fifth embodiment, when 3840 horizontal2160 vertical pixel signals are read out at 60 fps, for example. Note that in FIG. 9, the same signals as those in the timing chart of FIG. 5 are indicated by the same signal names.

In the fifth embodiment, the process for transferring the charges accumulated in the PDs 20 to the FDs 22 is carried out in units of sub-groups of two lines each, in the same manner as the transfer process described in the fourth embodiment with reference to FIG. 8. The number of signal lines in the selection circuit 12 can be reduced by using one of PTX_A(1) and PTX_B(1) in the transfer processes for the first row and the second row, and by using one of PTX_C(1) and PTX_(1) in the transfer processes for the third row and the fourth row, at that time.

Additionally, the process for reading out and AD-converting the signal based on the charge transferred to the FD 22 is carried out at the timing described in the second embodiment with reference to FIG. 6. As a result, the timings at which signals are read out from the pixels 11 are varied, which makes it possible to prevent local increases in energy consumption involved in the signal readout.

On the other hand, compared to the first embodiment, there is a tradeoff in that the signals SEL_A(1) to SEL_D(1) output to the AD conversion unit 14 have a shorter active period. For example, assume that as illustrated in FIG. 9, the time for which the AD conversion processes by the AD converters ADC_A to ADC_D overlap is two and a half horizontal synchronization periods. With the driving method of the first embodiment, illustrated in FIG. 5, if the 3840 horizontal×2160 vertical pixel signals at 60 fps are given a resolution of 14 bits, an operation frequency of approximately 0.53 GHz is required for the counter circuit 36. As opposed to this, in the fifth embodiment, only two and a half horizontal synchronization periods can be used, and thus the frequency required for the counter circuit 36 is approximately 0.84 GHz. However, the driving frequency can be suppressed compared to approximately 2.12 GHz which is the frequency required for the counter circuit 36 when AD-converting one row at a time.

Thus in the fifth embodiment, four rows are handled as a single group, and furthermore, every two rows in each group is handled as a single sub-group. This makes it possible to simplify the configuration of the selection circuit 12 and suppress the operation frequency of the clock circuit 35 required for the AD conversion unit 14, while preventing a local increase in power involved in the readout. This in turn makes it possible to carry out high-speed readout while suppressing the accumulation of distortion on a group-by-group basis, which has been a conventional problem.

Note that the process for reading out and AD-converting the signal based on the charge transferred to the FD 22 may be carried out at the timing described with reference to FIG. 7. In this case, four of the ramp circuits 33, or a circuit that delays the ramp signal, is necessary, in accordance with the AD converters ADC_A, ADC_B, ADC_C, and ADC_D.

In the above-described first to fifth embodiments, four AD converters ADC_A to ADC_D are provided in parallel for each column in order to process four rows' worth of electrical signals simultaneously. Four rows' worth of serial data is generated by each AD conversion unit 14 via the P/S conversion circuit 37 and supplied to the DFE 103 in a later stage. At this time, it is also possible to send the four rows' worth of P/S conversion circuit 37 output to the DFE 103 in a later stage together as a single piece of serial data. Furthermore, the signals may be sent to the DFE 103 as parallel data without going through the P/S conversion circuit 37 as described above.

Although the foregoing first to fourth embodiments describe using four rows as a single group, the number of rows constituting each group is not limited thereto, and the embodiments can be carried out using any number of rows, such as eight, twelve, or the like. The number of AD converters in each row may be increased in accordance with the number of rows included in a single group. Increasing the number of rows constituting a single group makes it possible to further suppress the operation frequency of the clock circuit 35.

Additionally, although the foregoing fourth and fifth embodiments describe using two rows as a single sub-group, the number of rows constituting a single subgroup is not limited thereto.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-099795, filed on May 24, 2018, which is hereby incorporated by reference herein in its entirety.

What is claimed is:
1. An image sensor, comprising:
a pixel unit including a plurality of pixels, each of the pixels including a photoelectric converter that photoelectrically converts received light into a charge, a charge accumulation portion that holds the charge, and a transfer circuit provided between the photoelectric converter and the charge accumulation portion;
AD converters that AD-convert electrical signals read out from the pixel unit, a first number of the AD converters being provided for each of columns of the pixel unit; and
one or more processors and/or circuitry which functions as a controller that controls readout of the pixel unit,
wherein the first number is a plural number, and the controller controls the transfer circuits to transfer the charges from the photoelectric converters to the charge accumulation portions every number of rows that is lower than the first number, and
wherein the controller controls the transfer circuits to transfer the charges from the photoelectric converters to the charge accumulation portions in order one row at a time, and carries out control so that upon the transfer of charges to the charge accumulation portions being completed for the first number of rows, electrical signals corresponding to the charges transferred to the charge accumulation portions are output in parallel to different ones of the AD converters from row to row.

2. An image sensor, comprising:
a pixel unit including a plurality of pixels, each of the pixels including a photoelectric converter that photoelectrically converts received light into a charge, a charge accumulation portion that holds the charge, and a transfer circuit provided between the photoelectric converter and the charge accumulation portion;
AD converters that AD-convert electrical signals read out from the pixel unit, a first number of the AD converters being provided for each of columns of the pixel unit; and
one or more processors and/or circuitry which functions as a controller that controls readout of the pixel unit, wherein the first number is a plural number, and the controller controls the transfer circuits to transfer the charges from the photoelectric converters to the charge accumulation portions every number of rows that is lower than the first number, and wherein the controller controls the transfer circuits to transfer the charges from the photoelectric converters to the charge accumulation portions in order every second number of rows, the second number being smaller than the first number, and carries out control so that upon the transfer of charges to the charge accumulation portions being completed for the first number of rows, electrical signals corresponding to the charges transferred to the charge accumulation portions are output in parallel to different ones of the AD converters from row to row.

3. An image sensor, comprising:

a pixel unit including a plurality of pixels, each of the pixels including a photoelectric converter that photoelectrically converts received light into a charge, a charge accumulation portion that holds the charge, and a transfer circuit provided between the photoelectric converter and the charge accumulation portion;

AD converters that AD-convert electrical signals read out from the pixel unit, a first number of the AD converters being provided for each of columns of the pixel unit; and one or more processors and/or circuitry which functions as a controller that controls readout of the pixel unit, wherein the first number is a plural number, and the controller controls the transfer circuits to transfer the charges from the photoelectric converters to the charge accumulation portions every number of rows that is lower than the first number, and wherein the controller controls the transfer circuits to transfer the charges from the photoelectric converters to the charge accumulation portions in order one row at a time, and carries out control so that electrical signals corresponding to the charges transferred to the charge accumulation portions are output to different ones of the AD converters from row to row, in order one row at a time at a predetermined time interval.

4. The image sensor according to claim 3, wherein the AD converter AD-converts the electrical signals in the first number of rows in parallel upon the output of the electrical signals in the first number of rows being completed.

5. The image sensor according to claim 3, wherein the AD converter carries out the AD conversion at timings that differ from row to row upon the output of the electrical signals being complete for each row.

6. An image sensor, comprising:

a pixel unit including a plurality of pixels, each of the pixels including a photoelectric converter that photoelectrically converts received light into a charge, a charge accumulation portion that holds the charge, and a transfer circuit provided between the photoelectric converter and the charge accumulation portion;

AD converters that AD-convert electrical signals read out from the pixel unit, a first number of the AD converters being provided for each of columns of the pixel unit; and one or more processors and/or circuitry which functions as a controller that controls readout of the pixel unit, wherein the first number is a plural number, and the controller controls the transfer circuits to transfer the charges from the photoelectric converters to the charge accumulation portions every number of rows that is lower than the first number, and wherein the controller controls the transfer circuits to transfer the charges from the photoelectric converters to the charge accumulation portions in order every second number of rows, the second number being smaller than the first number, and carries out control so that electrical signals corresponding to the charges transferred to the charge accumulation portions are output to different ones of the AD converters from row to row, in order one row at a time at a predetermined time interval.

7. The image sensor according to claim 6, wherein the AD converters AD-convert the electrical signals in the first number of rows in parallel upon the output of the electrical signals in the first number of rows being completed.

8. The image sensor according to claim 6, wherein the AD converters carry out the AD conversion at timings that differ from row to row upon the output of the electrical signals being complete for each row.

9. An image capturing apparatus comprising:

an image sensor having a pixel unit including a plurality of pixels, each of the pixels including a photoelectric converter that photoelectrically converts received light into a charge, a charge accumulation portion that holds the charge, and a transfer circuit provided between the photoelectric converter and the charge accumulation portion;

AD converters that AD-convert electrical signals read out from the pixel unit, a first number of the AD converters being provided for each of columns of the pixel unit; and one or more processors and/or circuitry which functions as a controller that controls readout of the pixel unit, wherein the first number is a plural number, the controller controls the transfer circuits to transfer the charges from the photoelectric converters to the charge accumulation portions every number of rows that is lower than the first number, and one or more processors and/or circuitry which functions as an image processor that carries out image processing on a signal output from the image sensor, and wherein the controller controls the transfer circuits to transfer the charges from the photoelectric converters to the charge accumulation portions in order one row at a time, and carries out control so that upon the transfer of charges to the charge accumulation portions being completed for the first number of rows, electrical signals corresponding to the charges transferred to the charge accumulation portions are output in parallel to different ones of the AD converters from row to row.

* * * * *